United States Patent [19]

Briggs

[11] Patent Number: 4,595,845

[45] Date of Patent: Jun. 17, 1986

[54] NON-OVERLAPPING CLOCK CMOS CIRCUIT WITH TWO THRESHOLD VOLTAGES

[75] Inventor: Willard S. Briggs, Carrollton, Tex.

[73] Assignee: Mostek Corporation, Carrollton, Tex.

[21] Appl. No.: 589,192

[22] Filed: Mar. 13, 1984

[51] Int. Cl.[4] .................. H03K 19/096; H03K 17/30
[52] U.S. Cl. .................................... 307/443; 307/450; 307/452; 307/481; 307/360; 307/579; 307/264; 377/79
[58] Field of Search ............... 307/443, 469, 450–452, 307/481, 360, 579, 583, 585, 264, 269, 304; 357/23.12, 42; 377/79, 105

[56] References Cited

U.S. PATENT DOCUMENTS

| | | | |
|---|---|---|---|
| 3,958,187 | 5/1976 | Suzuki et al. | 377/79 X |
| 4,250,406 | 2/1981 | Alaspa | 377/79 X |
| 4,390,797 | 6/1983 | Ishimoto | 307/264 |
| 4,406,957 | 9/1983 | Atherton | 307/264 X |
| 4,446,390 | 5/1984 | Alaspa | 307/579 |
| 4,463,273 | 7/1984 | Dingwall | 307/450 |
| 4,485,390 | 11/1984 | Jones et al. | 357/23.12 |
| 4,508,983 | 4/1985 | Allgood et al. | 307/443 X |

OTHER PUBLICATIONS

Dennard, "Variation in Threshold Voltage Using Reduced Source-Drain Spacing", *IBM Tech. Disc. Bull.*, vol. 12, No. 9, Feb. 1970, p. 1391.

*Primary Examiner*—Stanley D. Miller
*Assistant Examiner*—D. R. Hudspeth
*Attorney, Agent, or Firm*—Eric W. Petraske

[57] ABSTRACT

A set of clock-controlled CMOS logic circuits employ a single pair of non-overlapping clocks controlling a set of transmission gates that have only a single pass transistor and a compensating non-standard threshold voltage in a portion of the logic gates.

1 Claim, 3 Drawing Figures

NON-OVERLAPPING CLOCK CMOS CIRCUIT WITH TWO THRESHOLD VOLTAGES

DESCRIPTION

1. Technical Field

The field of the invention is that of CMOS logic circuits, in particular those controlled by clock signals.

2. Background Art

Conventionally, CMOS integrated circuits use overlapping clock signals and careful adjustment of threshold voltages to control timing problems. If non-overlapping clocks were used, the prior art four sets of clock lines, a pair of clock signals and their counterparts.

One prior art U.S. Pat. No. 4,250,406 discloses the use of a single clock line together with four different threshold voltages for different transistors. This approach is not only subject to the complexities of having four different threshold voltages, but it is also subject to danger from race conditions in the timing.

DISCLOSURE OF INVENTION

The invention relates to a clock-controlled CMOS logic circuit using non-overlapping clocks and a set of two threshold voltages: a standard N-channel threshold voltage; and a non-standard P-channel threshold voltage.

Each logic circuit consists of a pass circuit having a single N-channel transistor and a logic unit having a pull-up section with a non-standard P-channel threshold and a pull-down section with a standard N-channel threshold.

BEST MODE FOR CARRYING OUT THE INVENTION

Figure 1:
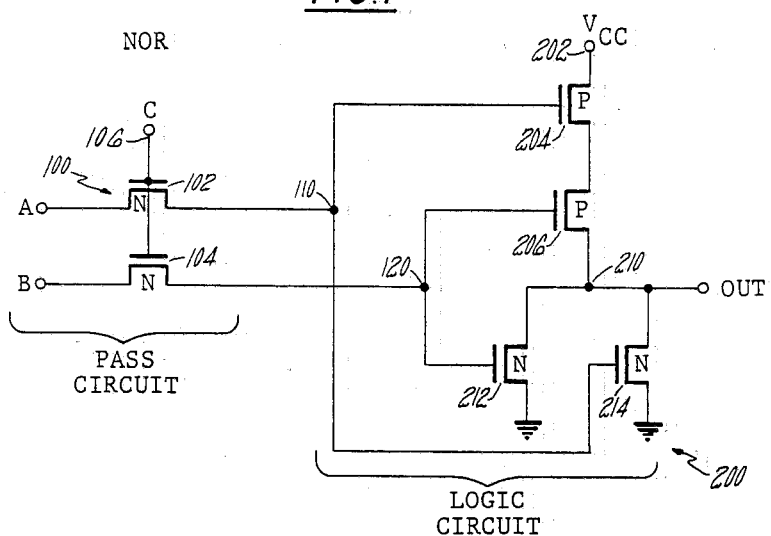
FIG. 1 illustrates a NOR circuit with dynamically latched inputs constructed according to the invention.

FIG. 1 illustrates a NOR circuit comprising subcircuit 100 which is referred to as the pass circuit and logic circuit 200 which performs the logical operation. Within the pass circuit 100, input terminals A and B contain signals that are either logical ONE or logical ZERO. Pass transistors 102 and 104, both controlled by the C clock on terminal 106, pass the input signals through to nodes 110 and 120, respectively. Nodes 110 and 120 are referred to as intermediate nodes because they are intermediate between the pass circuit and the logic circuit. Node 110, for example, controls both the gate of P-channel transistor 204 and N-channel transistor 214. Similarly, node 120 controls the gate of P-channel transistor 206 and N-channel transistor 212. The term "signal transfer means" is used in this application to refer to a direct or indirect connection. P-channel transistors 204 and 206 together comprise the "pull-up" section of the logic circuit, in that when they are both ON they pull output node 210 up to the voltage on VCC terminal 202. Similarly, N-channel transistors 212 and 214 are referred to as the "pull-down" section because when either is ON the voltage on node 210 is pulled down to ground.

The operation of the NOR circuit is conventional: i.e., when both nodes 110 and 120 are low, both transistors 204 and 206 are turned ON and both transistors 212 and 214 are turned OFF so that the voltage on node 210 is high. For any other condition, the voltage on node 210 is low. The effect of using a single pass transistor instead of the conventional pair of parallel P- and N-channel pass transistors is that the voltage swing on nodes 110 and 120 does not rise to the full value of VCC. Because N-channel transistors are used, the voltages on nodes 110 and 120 will go down to zero volts in response to an input signal, but it will not rise to the full value of VCC. In order to compensate for this smaller voltage, the threshold voltages of both P-channel transistors 204 and 206 are changed to a non-standard value of approximately −2 volts. With this threshold change, the top voltage of about 3.5 volts on nodes 110 and 120 will turn OFF transistors 204 and 206 sufficiently hard that there will be no static current between terminal 202 and node 210. This circuit, then, may be constructed with only two types of transistors: a standard N-channel transistor having a threshold voltage of about +0.8 volts, and a non-standard P-channel transistor having the threshold voltage of −2 volts.

Figure 2:
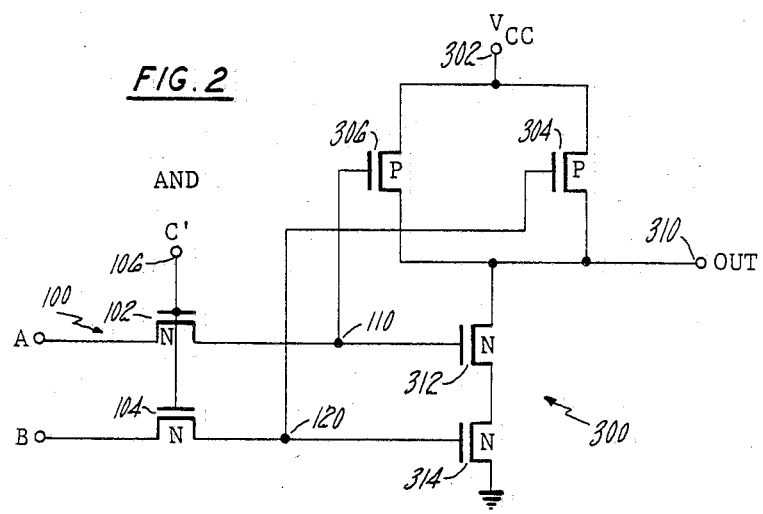
FIG. 2 illustrates an AND circuit with dynamically latched inputs constructed according to the invention.

Referring now to FIG. 2, an AND circuit is shown in which input circuit 100 is the same as that in FIG. 1 and the pull-up section of logic circuit 300 comprises two P-channel transistors in parallel, 304 and 306, respectively, connected between node 302 at VCC and the output node 310. The pull-down section is now two N-channel transistors 312 and 314 connected in series between the output node 310 and ground. The threshold voltages of these transistors are the same as those in the circuit of FIG. 1; i.e., the P-channel transistors 304 and 306 have a threshold of −2 volts and the other transistors have the standard N-channel threshold of +0.8 volts.

Figure 3:
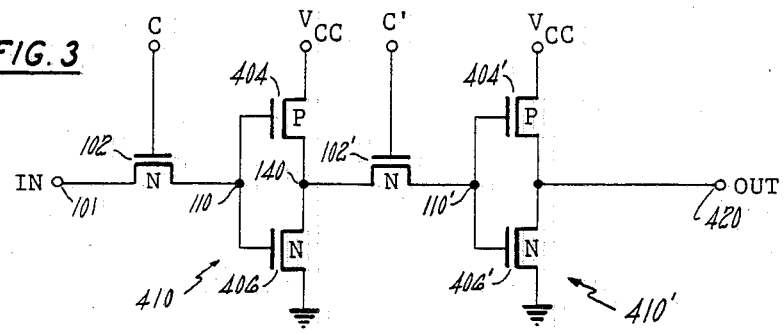
FIG. 3 illustrates a shift register circuit constructed according to the invention.

FIG. 3 illustrates a shifting circuit for translating an input to an output terminal under control of two clocks, C and C'. When clock C is turned ON the signal on input terminal 101 passes through N-channel transistor 102 to node 110. The voltage on node 110 controls the voltage on node 140 to be the inverse, as is conventional. The voltage will remain on node 110 after clock C has returned to ground for a time that will be determined by the stray capacitance of node 110 and the leakage current from it. This period of time will be more than sufficient for clock C' to open pass transistor 102' and transfer the voltage on node 140 to the voltage on node 110'. The second inverter circuit 410' is identical to inverter circuit 410 above. The voltage on output node 420 will thus be the inverse of the voltage on node 110' and will be equal to the value of the voltage on node 101 one clock cycle before. The voltages on these transistors are the same as those in the circuits in FIGS. 1 and 2. P-channel transistors 404 and 404' have the non-standard threshold voltage of −2 volts; and N-channel transistors 102, 406, 102' and 406' have the standard N-channel threshold voltage of +0.8.

Those skilled in the art will readily be able to devise combinations of these basic logic circuits to perform all of the standard Boolean algebra functions. These sub-logic circuits may be combined, as is well known in the art, to form more complex logical circuits of a wide variety.

The advantage of this invention compared to the prior art, is that improved control of the timing of the circuit is achieved by the use of non-overlapping clocks at the cost of only two clock generators and two clock distribution networks, compared with the prior art approach of using four clock generators and four distribution networks for a CMOS non-overlapping clock circuit. This invention also offers the opportunity to construct a CMOS circuit with only two threshold voltages: the standard N-channel threshold voltage and the non-standard P-channel threshold voltage. It may be preferable in some cases, to have a standard P-channel threshold voltage available as well for logic circuits that do not use transmission gates.

The setting of the threshold voltages may be done by conventional ion implantation steps, well known to those skilled in the art. In the worst case, a CMOS circuit constructed according to this invention would require only three threshold voltages, the N- and P-channel voltages required by this invention and a possible optional standard P-channel threshold voltage of approximately −0.8 volts.

Those skilled in the art will readily appreciate that it is possible to construct a CMOS circuit using only P-channel pass transistors together with a non-standard threshold on the N-channel devices.

I claim:

1. A CMOS integrated circuit comprising:
    clock means for generating at least one clock signal;
    clock distribution means for distributing said at least one clock signal to selected points within said integrated circuit;
    a high voltage distribution network;
    a ground distribution network;
    at least two controllable logic circuits, each having an input terminal, an output terminal and a control terminal, for performing logical operations under control of a clock signal at said control terminal, on an input signal on said input terminal; characterized in that:
    said clock means generates two non-overlapping clock signals;
    said distribution means comprises two electrically isolated distribution networks for distributing said two non-overlapping clock signals; and
    all of said at least two controllable logic circuits comprise at least one transmission gate and at least one logic unit, said at least one transmission gate and logic unit sharing an intermediate node that couples the output of said transmission gate to the input of said logic unit;
    each controllable logic circuit comprises a pull-up section connected between said high voltage distribution network and said output terminal of said logic circuit and a pull-down section connected between said output terminal of said logic circuit and said ground distribution network;
    in which controllable logic circuits, all of said transmission gates comprise at least one N-channel pass transistor connected between said input terminal and said intermediate node and having a gate controlled by one of said non-overlapping clock signals, said N-channel pass transistors all having a standard threshold voltage; and
    in which controllable logic circuits all of said pull-down sections comprise at least one N-channel transistor having said standard threshold voltage and being connected in a path between said output terminal and ground and having a gate connected by signal transfer means to said intermediate node; and
    in which controllable logic circuits all of said pull-up sections comprise at least one P-channel transistor having a non-standard P-channel negative threshold of absolute value greater than 1.5 volts connected in a path between said high voltage distribution network and said output terminal and having a gate connected by signal transfer means to said intermediate node;
    whereby said controllable logic circuits in said CMOS integrated circuit may be constructed with only two different threshold voltages:
    a standard N-channel threshold voltage; and
    a non-standard P-channel threshold voltage.

* * * * *